(12) United States Patent
Soeno

(10) Patent No.: US 8,471,291 B2
(45) Date of Patent: Jun. 25, 2013

(54) SEMICONDUCTOR DEVICE

(75) Inventor: Akitaka Soeno, Toyota (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 0 days.

(21) Appl. No.: 13/635,019

(22) PCT Filed: May 7, 2010

(86) PCT No.: PCT/JP2010/057814
§ 371 (c)(1),
(2), (4) Date: Sep. 14, 2012

(87) PCT Pub. No.: WO2011/138832
PCT Pub. Date: Nov. 10, 2011

(65) Prior Publication Data
US 2013/0009206 A1 Jan. 10, 2013

(51) Int. Cl.
*H01L 29/74* (2006.01)
*H01L 29/76* (2006.01)
*H01L 29/94* (2006.01)
*H01L 31/111* (2006.01)
*H01L 31/062* (2006.01)

(52) U.S. Cl.
USPC ........... 257/140; 257/133; 257/139; 257/146; 257/370

(58) Field of Classification Search
USPC .................. 257/140, 133, 139, 146, 135, 370, 257/565, 328, 273, 378, 162, 477, 517, 526
See application file for complete search history.

(56) References Cited

U.S. PATENT DOCUMENTS

| 4,777,579 A | 10/1988 | Jahns et al. |
| 4,783,690 A | 11/1988 | Walden et al. |
| 5,557,128 A | 9/1996 | Yamazaki et al. |
| 5,559,355 A | 9/1996 | Yamazaki et al. |
| 5,828,112 A | 10/1998 | Yamaguchi |

(Continued)

FOREIGN PATENT DOCUMENTS

| JP | 7-245394 A | 9/1995 |
| JP | 9-148579 A | 6/1997 |

(Continued)

OTHER PUBLICATIONS

International Search Report of PCT/JP2010/052488 mailed Dec. 2, 2010 & Written Opinion.

(Continued)

*Primary Examiner* — Chuong A. Luu
(74) *Attorney, Agent, or Firm* — Kenyon & Kenyon LLP

(57) ABSTRACT

In a semiconductor device in which a diode and an IGBT are formed in a main region of a same semiconductor substrate, in order to obtain a sufficiently large sense IGBT current in a stable manner, a sense region is provided with a first region in which a distance from an end of a main cathode region on a side of the sense region in a plan view of the semiconductor substrate is equal to or longer than 615 μm. Alternatively, in order to obtain a sufficiently large sense diode current in a stable manner, the sense region is provided with a second region in which a distance from the main cathode region in a plan view of the semiconductor substrate is equal to or shorter than 298 μm. The sense region may be provided with both the first region and the second region.

6 Claims, 12 Drawing Sheets

U.S. PATENT DOCUMENTS

| | | |
|---|---|---|
| 6,180,966 B1 | 1/2001 | Kohno |
| 6,221,721 B1 * | 4/2001 | Takahashi .................... 438/270 |
| 2005/0017290 A1 | 1/2005 | Takahashi et al. |
| 2007/0108468 A1 | 5/2007 | Takahashi |
| 2007/0158680 A1 | 7/2007 | Ozeki et al. |
| 2008/0315248 A1 | 12/2008 | Tokura et al. |
| 2009/0001411 A1 * | 1/2009 | Tokura et al. ................ 257/140 |
| 2009/0057832 A1 | 3/2009 | Kouno |
| 2009/0114947 A1 | 5/2009 | Fukuda |
| 2011/0297934 A1 | 12/2011 | Soeno |
| 2012/0025264 A1 | 2/2012 | Kouno |

FOREIGN PATENT DOCUMENTS

| | | |
|---|---|---|
| JP | 10-041510 A | 2/1998 |
| JP | 10-326897 A | 12/1998 |
| JP | 2001-015750 A | 1/2001 |
| JP | 2004-088001 A | 3/2004 |
| JP | 2006-271098 A | 10/2006 |
| JP | 2007-134625 A | 5/2007 |
| JP | 2009-099690 A | 5/2009 |
| JP | 2009-117786 A | 5/2009 |
| JP | 2010-192565 A | 9/2010 |
| JP | 2012-009900 A | 12/2012 |
| WO | 2007/108456 A1 | 11/2007 |

OTHER PUBLICATIONS

International Preliminary Report on Patentability of PCT/JP2010/052488 issued Jul. 1, 2011.

International Search Report & Written Opinion of PCT/JP2010/057814 issued Aug. 10, 2010.

International Preliminary Report on Patentability of PCT/JP2010/057814 mailed Nov. 7, 2011.

Office Action issued in JP 2009-033688 on Aug. 30, 2011 and English translation thereof.

Office Action issued in JP 2011-222604 on Nov. 1, 2011 and English translation thereof.

Office Action issued in JP 2011-222604 on Feb. 21, 2012 and English translation thereof.

Office Action issued in JP 2011-222604 on Jun. 26, 2012 and English translation thereof.

* cited by examiner

SEMICONDUCTOR DEVICE

This is a 371 national phase application of PCT/JP2010/057814 filed 7 May 2010, the contents of which are incorporated herein by reference.

TECHNICAL FIELD

The technique described in the present description relates to a semiconductor device in which a diode and an IGBT are formed in a same semiconductor substrate.

BACKGROUND ART

In order to prevent destruction due to an overcurrent, a semiconductor device is provided with a sense region for sensing a current that flows through the semiconductor device. Japanese Patent Application Publication No. H7-245394 (patent document 1) discloses a semiconductor device provided with a main region in which an IGBT is formed and a sense region for sensing a current that flows through the main region, wherein the main region and the sense region are formed on a same semiconductor substrate. An IGBT similar to that of the main region is built into the sense region, and the sense region and the main region are arranged separated from each other by 100 μm or more. Accordingly, carrier interference in a boundary region between the sense region and the main region is prevented, and a current ratio of a main current that flows through the main region to a sense current that flows through the sense region is kept approximately constant.

Patent Document 1: Japanese Patent Application Publication No. H7-245394

SUMMARY OF INVENTION

Technical Problem

In a semiconductor device in which a diode and an IGBT are formed in a same semiconductor substrate, the diode comprises a first conductivity type anode region, a second conductivity type diode drift region, and a second conductivity type cathode region. The IGBT comprises a first conductivity type collector region, a second conductivity type drift region, a first conductivity type body region, a second conductivity type emitter region, and an insulated gate electrode. Since the diode and the IGBT are arranged adjacent to each other in the same semiconductor substrate, the second conductivity type cathode region and the first conductivity type collector region are formed adjacent to each other on a lower surface side of the semiconductor substrate.

The present inventor has discovered that, when further installing a sense region in a same semiconductor substrate of such a semiconductor device, depending on a distance between the sense region and a cathode region on a lower surface of the semiconductor substrate, there are cases where the sense region senses a diode current of a main region and cases where the sense region senses an IGBT current of the main region.

Solution to Technical Problem

A first semiconductor device disclosed in the present description comprises a semiconductor substrate including a main region and a sense region, the sense region being smaller than the main region in a plan view of the semiconductor substrate. In this semiconductor device, the main region comprises a main diode and a main IGBT, wherein the main diode comprises: a first conductivity type main anode region formed on an upper surface of the semiconductor substrate; a second conductivity type main diode drift region formed on a lower side of the main anode region; and a second conductivity type main cathode region formed on a lower side of the main diode drift region and on a lower surface of the semiconductor substrate, and the main IGBT comprises: a first conductivity type main collector region formed on a lower surface of the semiconductor substrate; a second conductivity type main drift region formed on an upper side of the main collector region; a first conductivity type main body region formed on an upper side of the main drift region and on an upper surface of the semiconductor substrate; a second conductivity type main emitter region formed on a part of an upper surface of the main body region; and a main insulated gate electrode formed from an upper surface of the main emitter region to a depth in which the main body region comes into contact with the main drift region. The sense region comprises: a first conductivity type sense collector region formed at least on a part of a lower surface of the semiconductor substrate; a second conductivity type sense drift region formed on an upper side of the sense collector region; a first conductivity type sense body region formed on an upper side of the sense drift region and on an upper surface of the semiconductor substrate; a second conductivity type sense emitter region formed on a part of an upper surface of the sense body region; and a sense insulated gate electrode formed from an upper surface of the sense emitter region to a depth in which the sense body region comes into contact with the sense drift region, wherein the sense region includes a first region, and a distance from the main cathode region to the sense emitter region of the first region in a plan view of the semiconductor substrate is equal to or longer than 615 μm.

According to the first semiconductor device, since the sense emitter region of the sense region includes a first region in which a distance from the main cathode region to the sense emitter region in a plan view of the semiconductor substrate is equal to or longer than 615 μm, an IGBT current that flows through the IGBT in the main region can be accurately sensed by the sense region.

The sense region may further comprise a second region, and a distance from the main cathode region to the sense emitter region of the first region in a plan view of the semiconductor substrate is equal to or shorter than 298 μm. A diode current that flows through the diode in the main region can also be accurately sensed by the sense region.

The sense drift region, the sense body region, the sense emitter region, and the sense insulated gate electrode may be formed continuously from the first region to the second region in the plan view of the semiconductor substrate.

A diffusion layer may be formed in at least a part of a region between the first region and the second region, the diffusion layer extending from the upper surface of the semiconductor substrate in a depth direction.

The diffusion layer may be formed in a region of which a distance from the main cathode region in the plan view of the semiconductor substrate is longer than 298 μm and shorter than 615 μm.

A second semiconductor device disclosed in the present description comprises a semiconductor substrate including a main region and a sense region, the sense region being smaller than the main region in a plan view of the semiconductor substrate. In this semiconductor device, the main region comprises a main diode and a main IGBT, wherein the main diode comprises: a first conductivity type main anode region formed on an upper surface of the semiconductor substrate; a second conductivity type main diode drift region formed on a lower side of the main anode region; and a second conductivity type main cathode region formed on a lower side of the main diode drift region and on a lower surface of the semiconductor substrate, and the main IGBT comprises: a first conductivity type main collector region formed on a lower surface of the semiconductor substrate; a second conductivity type main drift region formed on an upper side of the main collector region; a first conductivity type main body region formed on an upper side of the main drift region and on an upper surface of the semiconductor substrate; a second conductivity type main emitter region formed on a part of an upper surface of the main body region; and a main insulated gate electrode formed from an upper surface of the main emitter region to a depth in which the main body region comes into contact with the main drift region. The sense region comprises: a first conductivity type sense collector region formed on at least a part of a lower surface of the semiconductor substrate; a second conductivity type sense drift region formed on an upper side of the sense collector region; a first conductivity type sense body region formed on an upper side of the sense drift region and on an upper surface of the semiconductor substrate; a second conductivity type sense emitter region formed on a part of an upper surface of the sense body region; and a sense insulated gate electrode formed from an upper surface of the sense emitter region to a depth in which the sense body region comes into contact with the sense drift region, wherein the sense region includes a second region, and a distance from the main cathode region of the second region to the sense emitter region in a plan view of the semiconductor substrate is equal to or shorter than 298 μm.

According to the second semiconductor device, since the sense emitter region of the sense region includes the second region in which the distance from the main cathode region to the sense emitter region in the plan view of the semiconductor substrate is equal to or shorter than 298 μm, the IGBT current that flows through the IGBT in the main region can be accurately sensed by the sense region.

DESCRIPTION OF EMBODIMENTS

First Embodiment

Figure 1:
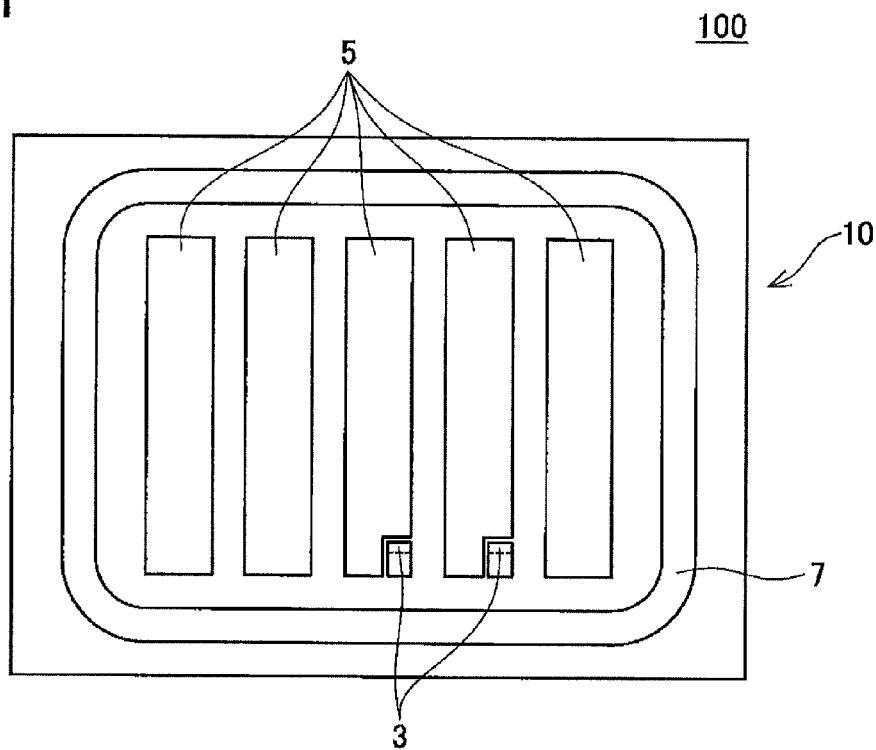
FIG. 1 is a plan view of a semiconductor device according to an embodiment.

Hereinafter, a first embodiment of the present invention will be described with reference to the drawings. FIG. 1 is a plan view of a semiconductor device 100. As shown in FIG. 1, the semiconductor device 100 comprises a main region 5, a sense region 3, and a termination region 7 that surrounds the main region 5 and the sense region 3, all formed on a semiconductor substrate 10. The sense region 3 is smaller than the main region 5.

Figure 2:
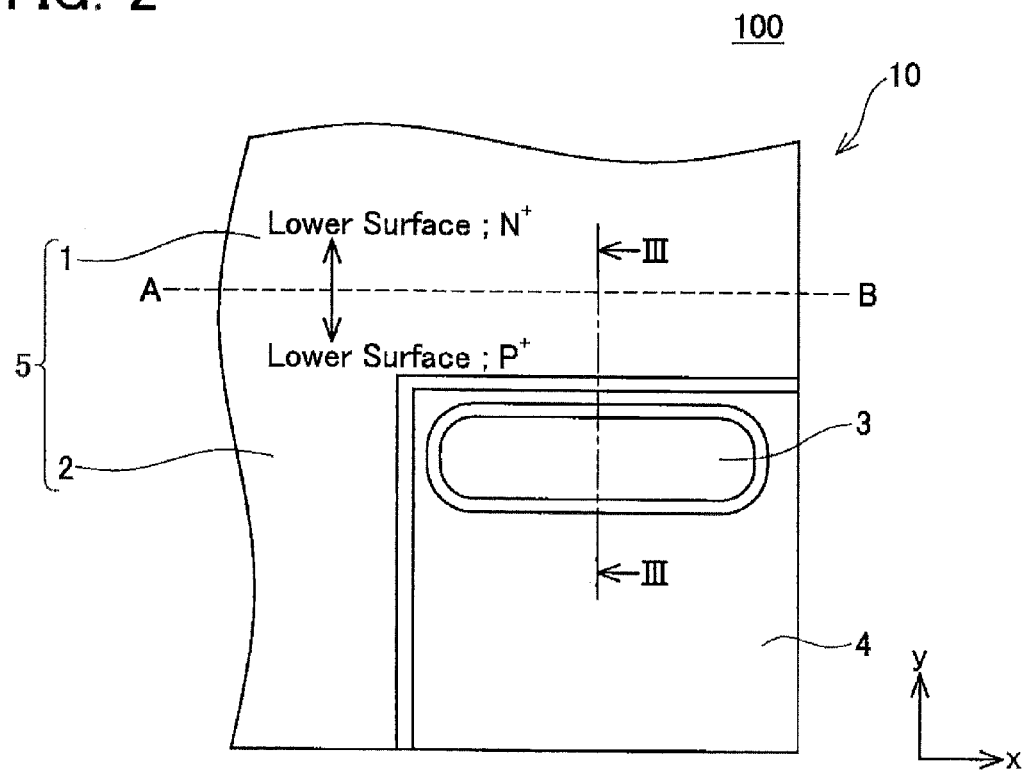
FIG. 2 is a diagram which is an enlargement of a vicinity of a boundary portion between a main region and a sense region in the plan view of the semiconductor device shown in FIG. 1 and which shows a semiconductor device according to a first embodiment.
Figure 3:
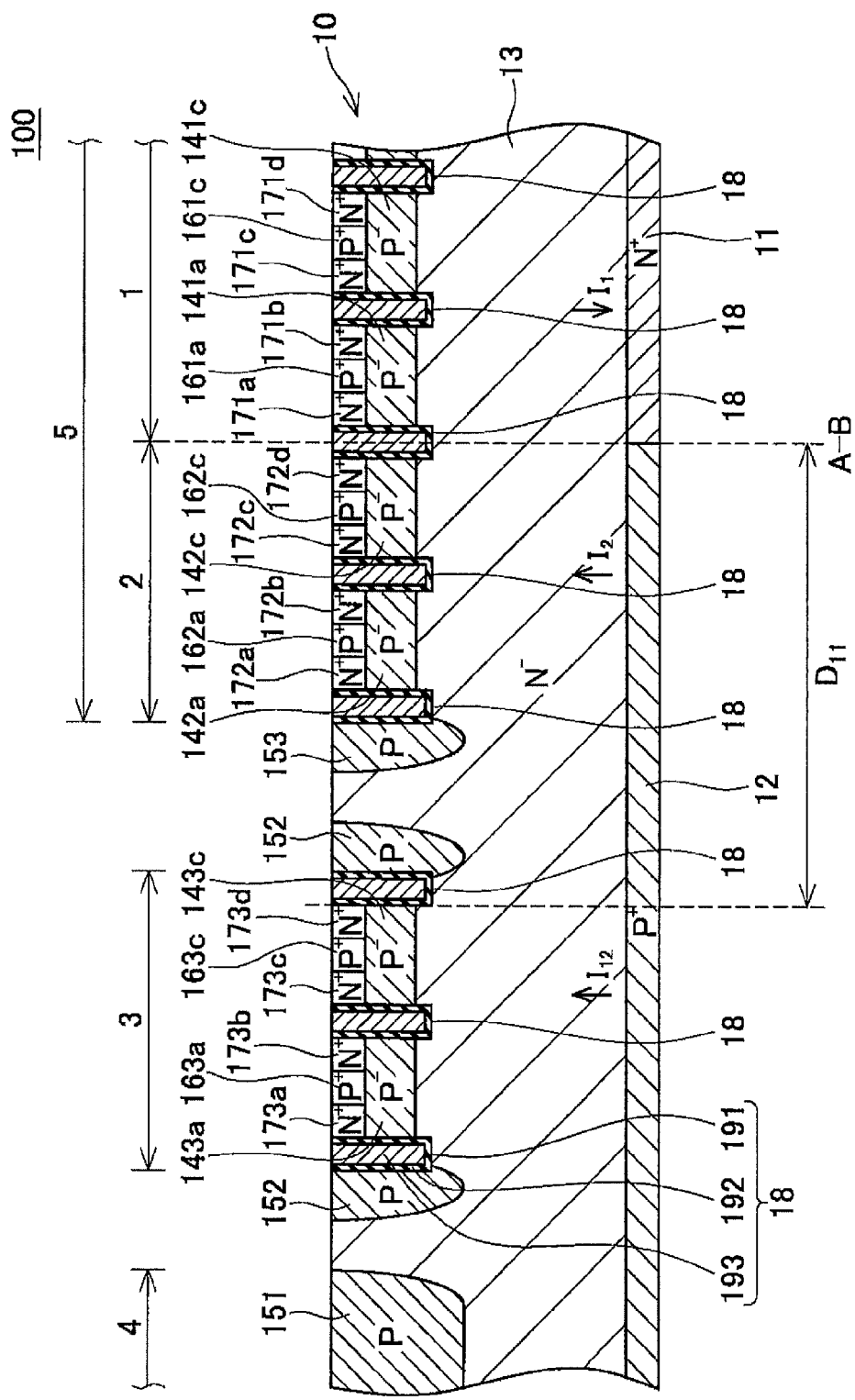
FIG. 3 is a cross-sectional view taken along line in FIG. 2.

FIG. 2 is an enlarged view of a vicinity of a boundary portion between the main region 5 and the sense region 3 of the semiconductor device 100 shown in FIG. 1, and FIG. 3 is an enlarged view of a cross section taken along a line in FIG. 2.

As shown in FIGS. 2 and 3, the main region 5 comprises a main diode region 1 and a main IGBT region 2. The semiconductor substrate 10 comprises a first $N^+$ layer 11, a first $P^+$ layer 12 adjacent to the first $N^+$ layer 11, an $N^-$ layer 13 formed on upper surfaces of the first $N^+$ layer 11 and the first $P^+$ layer 12, and $P^-$ layers 141a, 141c, 142a, 142c, 143a, and 143c and P layers 151, 152, and 153 formed on an upper surface of the $N^-$ layer 13. Second $P^+$ layers 161a and 161c and second $N^+$ layers 171a to 171d are provided on upper surfaces of the $P^-$ layers 141a and 141c. Second $P^+$ layers 162a and 162c and second $N^+$ layers 172a to 172d are provided on upper surfaces of the $P^-$ layers 142a and 142e. Second $P^+$ layers 163a and 163c and second $N^+$ layers 173a to 173d are provided on upper surfaces of the $P^-$ layers 143a and 143c. Moreover, the $P^-$ layers 141a, 141c, 142a, 142c, 143a, and 143c have similar structures. The second $P^+$ layers 161a, 161c, 162a, 162c, 163a, and 163c have similar structures. The second $N^+$ layers 171a to 171d, 172a to 172d, and 173a to 173d have similar structures. Reference numerals 141, 161, and 171 are assigned to layers included in the main diode region 1. Reference numerals 142, 162, and 172 are assigned to layers included in the main IGBT region 2. Reference numerals 143, 163, and 173 are assigned to layers included in the sense region 3. The P layers 151, 152, and 153 are formed to deeper positions in the semiconductor substrate 10 compared to the $P^-$ layers 141a, 141c, 142a, 142c, 143a, and 143c. The P layers 151, 152, and 153 are diffusion layers that do not contribute to electrical conduction. The sense region 3 is enclosed by the P layer 152 and the main region 5 is enclosed by the P layer 153. The P layers 152 and 153 suppress migration of carriers between the sense region 3 and the main region 5. In other words, the P layers 152 and 153 are element isolation layers.

A plurality of trench gates 18 is provided from an upper surface of the semiconductor substrate 10 towards the $N^-$ layer 13. A depth of the trench gates 18 is deeper than the $P^-$ layers 141a, 141c, 142a, 142c, 143a, and 143c and shallower than the P layers 151, 152, and 153. Each trench gate 18 comprises a gate insulating film 192 formed in a trench 191 and a gate electrode 193 filled into the trench 191. The second N⁺ layers 171a to 171d, 172a to 172d, and 173a to 173d are respectively in contact with the trench gates 18. A longitudinal direction of the trench gates 18 is parallel to an x-axis direction shown in FIG. 2.

As shown in FIGS. 2 and 3, the main diode region 1 is a region in which the first N⁺ layer 11 is formed on a lower surface side of the semiconductor substrate 10 among the main region 5. The main diode region 1 comprises the first N⁺ layer 11 as a main cathode region, the N⁻ layer 13 as a main diode drift region, and the P⁻ layers 141a and 141c and the second P⁺ layers 163a and 163c as a main anode region.

The main IGBT region 2 is a region in which the first P⁺ layer 12 is formed on a lower surface side of the semiconductor substrate 10 among the main region 5. The main IGBT region 2 comprises the first P⁺ layer 12 as a main collector region, the N⁻ layer 13 as a main IGBT drift region, the P⁻ layers 142a and 142c as a main IGBT body region, the second N⁺ layers 172a to 172d as a main emitter region, the second P³⁺ layers 162a and 162c as a main body contact region, and the trench gates 18 as a main insulating gate.

In the present embodiment, a boundary between the main diode region 1 and the main IGBT region 2 is a boundary between the first N⁺ layer 11 and the first P⁺ layer 12 formed on the lower surface side of the semiconductor substrate 10. The boundary between the first N⁺ layer 11 and the first P⁺ layer 12 is shown as a line segment AB in FIGS. 2 and 3. The boundary (the line segment AB) between the first N⁺ layer 11 and the first P⁺ layer 12 is parallel to the longitudinal direction of the trench gates 18. In other words, the boundary (the line segment AB) between the first N⁺ layer 11 and the first P⁺ layer 12 is parallel to the x axis shown in FIG. 2. As shown in FIGS. 2 and 3, the main diode region 1 and the main IGBT region 2 have a same construction of the N⁻ layer 13 of the semiconductor substrate 10 and a layer formed on an upper surface of the N⁻ layer 13 (a layer on an upper surface side of the N⁻ layer 13), and only differ from each other in a layer on a lower surface side of the N⁻ layer 13 (the first N⁺ layer 11 or the first P⁺ layer 12). In other words, in the main region 5 of the semiconductor device 100, setting the first N⁺ layer 11 as the layer on the lower surface side of the semiconductor substrate 10 results in the main diode region 1 and setting the first P⁺ layer 12 as the layer on the lower surface side of the semiconductor substrate 10 results in the main IGBT region 2.

The sense region 3 is arranged on an upper surface side of the first P⁺ layer 12 in a similar manner to the main IGBT region 2. As shown in FIG. 2, the sense region 3 is longer in the x axis direction and shorter in a y axis direction. As shown in FIGS. 2 and 3, the sense region 3 is arranged adjacent to the main IGBT region 2. A main collector region of the main IGBT region 2 and a sense collector region of the sense region 3 are formed as a same layer (the first P⁺ layer 12). A construction of a layer of the sense region 3 on an upper surface side of the N⁻ layer 13 is similar to those in the main diode region 1 and the main IGBT region 2. In other words, in the sense region 3, the first P⁺ layer 12 is used as a sense collector region, the N⁻ layer 13 is used as a sense drift region, the P⁻ layers 143a and 143c are used as a sense body region, the second N⁺ layers 173a to 173d are used as a sense emitter region, the second P⁺ layers 163a and 163c are used as a sense body contact region, and the trench gate 18 are used as sense insulating gates.

The boundary (the line segment AB) between the first P⁺ layer 12 and the first N⁺ layer 11 is outside the P layer 152 formed around the sense region 3 and exists between the main diode region 1 and the main IGBT region 2. The boundary (the line segment AB) between the first P⁺ layer 12 and the first N⁺ layer 11 does not exist between the sense region 3 and the main IGBT region 2. A distance $D_{11}$ shown in FIG. 3 from the line segment AB to an end of the second N⁺ layer 173d that is a sense emitter region on a side of the main region 5 is $D_{11} \geqq 615$ μm. The distance $D_{11}$ corresponds to a distance from an end of the main cathode region (the first N⁺ layer 11) on a side of the sense region 3 to an end of the second N⁺ layer 173d that is a sense emitter region on a side of the main region 5.

A diffusion layer region 4 is adjacent to the sense region 3 and is arranged on a circumferential edge side of the semiconductor substrate. The diffusion layer region 4 comprises the P layer 151 that is a deep diffusion layer. The P layer 151 is a diffusion layer that does not contribute to electrical conduction.

The first N⁺ layer 11 and the first P⁺ layer 12 of the semiconductor device 100 are connected to a lower surface electrode (not shown). The second N⁺ layers 171a to 171d and 172a to 172d, and the second P⁺ layers 161a, 161c, 162a, and 162c are connected to a main upper surface electrode (not shown). The second N⁺ layers 173a to 173d and the second P⁺ layers 163a and 163c are connected to a sense upper surface electrode (not shown).

If a potential Va of the lower surface electrode is set higher than a potential Vb of the main upper surface electrode and a potential Vc of the sense upper surface electrode (Va>Vb, Vc) and a positive voltage (positive bias) is applied to the gate electrode 193, then a channel is formed in the main IGBT region 2 in the P⁻ layers 142a and 142c (the main body region) in a vicinity of the trench gates 18. Accordingly, a main IGBT current $I_2$ flows from the first P⁺ layer 12 (the main collector region) to the second N⁺ layers 172a to 172d (the main emitter region). A current does not flow in the main diode region 1.

Meanwhile, if the potential Va of the lower surface electrode is set lower than the potential Vb of the main upper surface electrode and the potential Vc of the sense upper surface electrode (Va<Vb, Vc), a main diode current $I_1$ flows in the main diode region 1 from the second P⁺ layers 161a and 161c and the P⁻ layers 141a and 141c (the main anode region) to the first N⁺ layer 11 (the main cathode region) via the N⁻ layer 13. A current does not flow in the main IGBT region 2.

The present inventor has discovered that, depending on a distance between the sense region and the main cathode region on the lower surface of the semiconductor substrate, there are cases where the sense region senses a main diode current $I_1$ and cases where the sense region senses a main IGBT current $I_2$.

Figure 4:
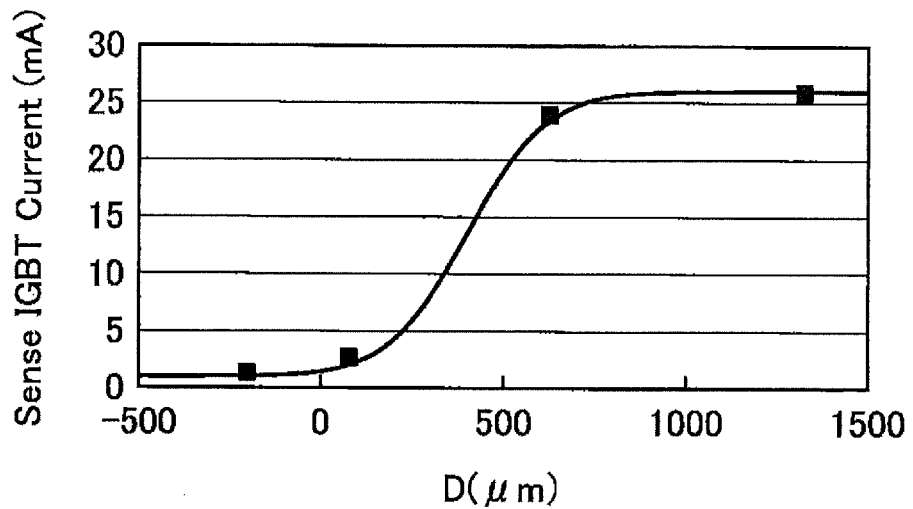
FIG. 4 is a diagram showing a sense IGBT current that is sensed by a sense region.
Figure 5:
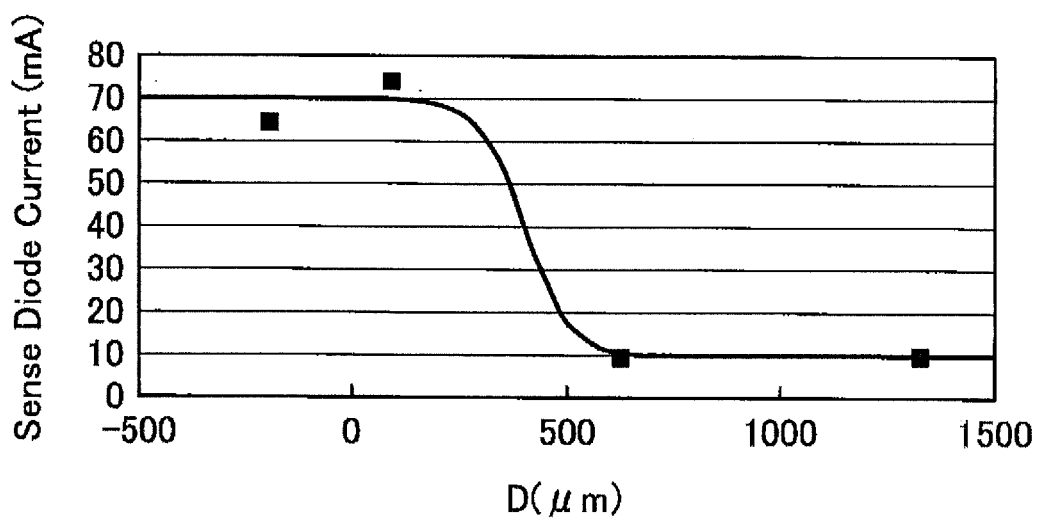
FIG. 5 is a diagram showing a sense diode current that is sensed by a sense region.
Figure 6:
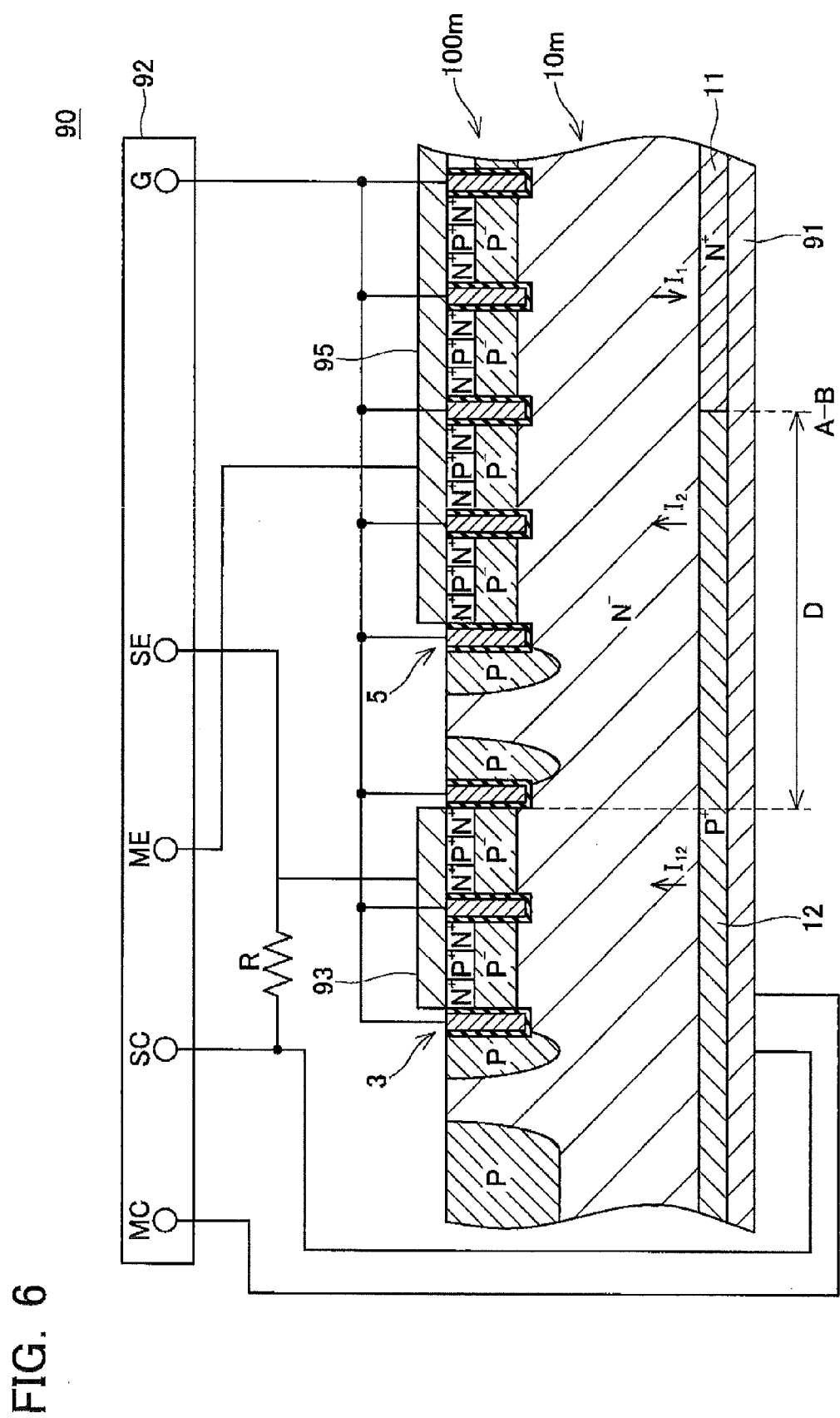
FIG. 6 is a diagram of a measurement circuit that measures a current sensed by a sense region.

FIGS. 4 and 5 show results of a study on how a current flowing through the sense region 3 changes depending on a distance between the sense region 3 and the main cathode region (the first N⁺ layer 11) on the lower surface of the semiconductor substrate 10. As shown in FIG. 6, the current flowing through the sense region 3 was measured by connecting a semiconductor device 100m to a measuring circuit. The semiconductor device 100m differs from the semiconductor device 100 in a pattern of a first N⁺ layer 11 and a first P⁺ layer 12 on a lower surface side of a semiconductor substrate 10m. Since other components of the semiconductor device 100m are similar to those of the semiconductor device 100, overlapping descriptions will be omitted.

The semiconductor device 100m in which a distance D between the sense region 3 and a main cathode region (the first N+ layer 11) on the lower surface of the semiconductor substrate 10 has been changed was manufactured by translating a position of an end of a main cathode region on a side of the sense region on the lower surface side of the semiconductor substrate 10m (in the present embodiment, corresponds to a position of a boundary (a line segment AB) between the first N+ layer 11 and the first P+ layer 12) in a direction parallel to a longitudinal direction of a trench (the y axis direction shown in FIG. 2). Moreover, a thickness of the semiconductor substrate 10m was set to 160 μm. Electrodes 91, 93, and 95 were formed on each of the semiconductor devices 100m in which a position of an end of the main cathode region on a sense region side was changed. Specifically, a sense upper surface electrode 93 was formed on an upper surface side of the sense region 3, a main upper surface electrode 95 was formed on an upper surface of the main region 5, and a lower surface electrode 91 was formed on the lower surface side. The semiconductor device 100m on which the electrodes 91, 93, and 95 were formed was connected to a measuring circuit 90 shown in FIG. 6. Specifically, a sense emitter terminal SE of a measuring device 92 was connected to the sense upper surface electrode 93, a main emitter terminal ME was connected to the main upper surface electrode 95, a main collector terminal MC and a sense collector terminal SC were connected to the lower surface electrode 91, and a gate terminal G was connected to a trench gate terminal. Furthermore, a shunt resistor R was connected between the sense emitter terminal SE and the sense collector terminal SC. Shunt resistors R of 5Ω, 10Ω, and 15Ω were respectively used. The sense emitter terminal SE and the main emitter terminal ME were grounded, and the main collector terminal MC and the sense collector terminal SC were set to a common potential that causes a collector current to equal a rated current. A gate voltage of 15V was applied to the gate terminal G. A value of a current flowing through the sense region was measured using the measuring circuit 90 for each of the semiconductor devices 100m in which the position of the end of the main cathode region on a sense region side was changed. Values of currents flowing through the shunt resistors were obtained by measuring a voltage drop at both ends of the 5Ω, 10Ω, and 15 Ω shunt resistors R and were further plotted on an xy coordinate system with an x axis representing resistance values of the shunt resistors R and a y axis representing currents flowing through the shunt resistors. Data of the plotted current values was extrapolated by a straight line, a value of a y intercept (a current value when a shunt resistance value is 0) was obtained, and the value of the y intercept was used as a sense current value.

FIG. 4 shows a value of a sense current (in other words, a sense IGBT current) flowing through the sense region 3 as measured by the measuring circuit 90 when Va>Vb, Vc and a positive bias is applied to the gate electrode (when the main IGBT current $I_2$ flows). FIG. 5 shows a value of a sense current (in other words, a sense diode current) flowing through the sense region 3 as measured by the measuring circuit 90 when Va<Vb, Vc (when a main diode current $I_1$ flows). Experimental points in FIGS. 4 and 5 represent experimental data described in Table 1 below, and curves represent regression equations based on the experimental data shown in Table 1. The curve in FIG. 4 is represented by Equation (1) below, and the curve in FIG. 5 is represented by Equation (2) below.

TABLE 1

| Distance D [μm] | Sense IGBT current [mA] | Sense diode current [mA] |
|---|---|---|
| 1324.5 | 25.7 | 9.63 |
| 626.5 | 23.9 | 9.35 |
| 87.0 | 2.6 | 74.2 |
| −195.0 | 1.3 | 64.5 |

[Equation 1]

$$f_1(D) = 13.5 + 12.5 \times \frac{\exp\left(\frac{D-400}{200}\right) - \exp\left(-\frac{D-400}{200}\right)}{\exp\left(\frac{D-400}{200}\right) + \exp\left(-\frac{D-400}{200}\right)} \quad (1)$$

$$f_2(D) = 40 + 30 \times \frac{\exp\left(\frac{D-400}{100}\right) - \exp\left(-\frac{D-400}{100}\right)}{\exp\left(\frac{D-400}{100}\right) + \exp\left(-\frac{D-400}{100}\right)} \quad (2)$$

As shown in FIG. 4, when distance D≦132 μm, the sense IGBT current hardly flows through the sense region 3 and has an approximately constant value. However, when the distance D exceeds 132 μm, the sense IGBT current increases as the distance D increases. When the distance D becomes D≧615 μm, a variation of the sense IGBT current with respect to the distance D decreases and the sense IGBT current once again converges to a constant value (26 mA). This constant value is a maximum value of the sense IGBT current that can be sensed by the sense region 3. If the sense IGBT current with a magnitude that equals or exceeds 90% (23.4 mA or greater) of the maximum value (26 mA) of the sense IGBT current can be sensed, a main IGBT current can be accurately sensed based on a measurement value of the sense IGBT current. According to Equation (1), when the distance D≧615 μm, the sense IGBT current with the magnitude that equals or exceeds 90% of the maximum value of the sense IGBT current can be sensed.

Meanwhile, regarding the sense diode current flowing through the sense region 3, as shown in FIG. 5, when distance D≧605 μm, the sense diode current hardly flows through the sense region 3 and has an approximately constant value. However, when the distance D falls below 605 μm, the sense diode current increases as the distance D decreases. When the distance D becomes D≦298 μm, a variation of the sense diode current with respect to the distance D decreases and the sense diode current once again converges to a constant value (70 mA). This constant value is a maximum value of the sense diode current that can be sensed by the sense region 3. If the sense diode current with a magnitude that equals or exceeds 90% (63 mA or greater) of the maximum value (70 mA) of the sense diode current can be sensed, the main diode current can be accurately sensed based on the measurement value of the sense diode current. According to Equation (2), when the distance D≦298 μm, the sense diode current with the magnitude that equals or exceeds 90% of the maximum value of the sense diode current can be sensed.

In FIGS. 4 and 5, an abscissa D represents a distance from an end of the main cathode region on a side of the sense region to an end of the sense emitter region on a side of the main region in a plan view of the semiconductor substrate 10. For example, a distance $D_{11}$ from an, end of the main cathode region (the first N+ layer 11) on a side of the sense region 3 or, in other words, from the line segment AB that is a boundary between the first P+ layer 12 and the first N+ layer 11 to an end of the N$^+$ layer 173d that is a sense emitter region on a side of the main region 5 in FIGS. 2 and 3 corresponds to a distance represented by the abscissa D in FIGS. 4 and 5.

In the semiconductor device 100, the sense region 3 is installed on the upper surface side of the first P$^+$ layer 12 in a similar manner to the main IGBT region 2. Since the distance $D_{11}$ from the end of the main cathode region (the first N$^+$ layer 11) on the side of the sense region 3 (in other words, the line segment AB) to the end of the second N$^+$ layer 173d that is the sense emitter region on the side of the main region 5 is equal to or longer than 615 μm, the second N$^+$ layers 173a to 173d which become the sense emitter region of the sense region 3 are all in the first region which has the distance of 615 μm or longer from the end of the main cathode region on the side of the sense region in a plan view of the semiconductor substrate, and the sense region 3 satisfies conditions as the first region. Therefore, the current flows through the sense region 3 in a similar manner to the main IGBT region 2. Specifically, a current hardly flows through the sense region 3 when Va<Vb, Vc. On the other hand, when Va>Vb, Vc and a positive bias is applied to the gate electrode, a sense IGBT current $I_{12}$ flows from the first P$^+$ layer 12 (the sense collector region) to the second N$^+$ layers 173a to 173d (the sense emitter region), and a current of this sense IGBT current is equal to or greater than 90% of the maximum value of the sense IGBT current. According to the semiconductor device 100, since a sufficiently large sense IGBT current $I_{12}$ can be obtained in a stable manner, the sensing accuracy of the main IGBT current by the sense region 3 can be enhanced.

As described above, the present embodiment comprises the first region (in other words, a region in which the distance from the main cathode region to the sense emitter region in the plan view of the semiconductor substrate is equal to or longer than 615 μm). Accordingly, since the sufficiently large sense IGBT current $I_{12}$ (the current that is equal to or greater than 90% of the maximum value of the sense IGBT current) flows through the sense region 3 in a stable manner, a ratio between the main IGBT current that flows through the main IGBT region and the sense IGBT current that flows through the sense region becomes sufficiently large and stabilizes. As a result, the main IGBT current can be accurately sensed using the sense region.

Moreover, a ratio $I_{12}/I_2$ between the sense IGBT current $I_{12}$ and the main IGBT current $I_2$ is dependent on a ratio $S_{12}/S_2$ between an area $S_2$ of the main IGBT region 2 and an area $S_{12}$ of the first region of the sense region 3 on the upper surface of the substrate. By adjusting the area ratio $S_{12}/S_2$, the ratio $I_{12}/I_2$ between the sense IGBT current $I_{12}$ and the main IGBT current $I_2$ can be adjusted. If the ratio $I_{12}/I_2$ is known, by sensing the sense IGBT current $I_{12}$, the main IGBT current $I_2$ can be sensed. For example, by connecting, in series, the shunt resistor (resistance value R) in advance to the circuit through which the sense IGBT current flows and measuring a voltage drop $RI_{12}$ on both ends of the shunt resistor, the sense IGBT current value $I_{12}$ can be sensed. The main IGBT current $I_2$ can be sensed based on the sensed sense IGBT current $I_{12}$ and the ratio $I_{12}/I_2$.

Second Embodiment

Figure 7:
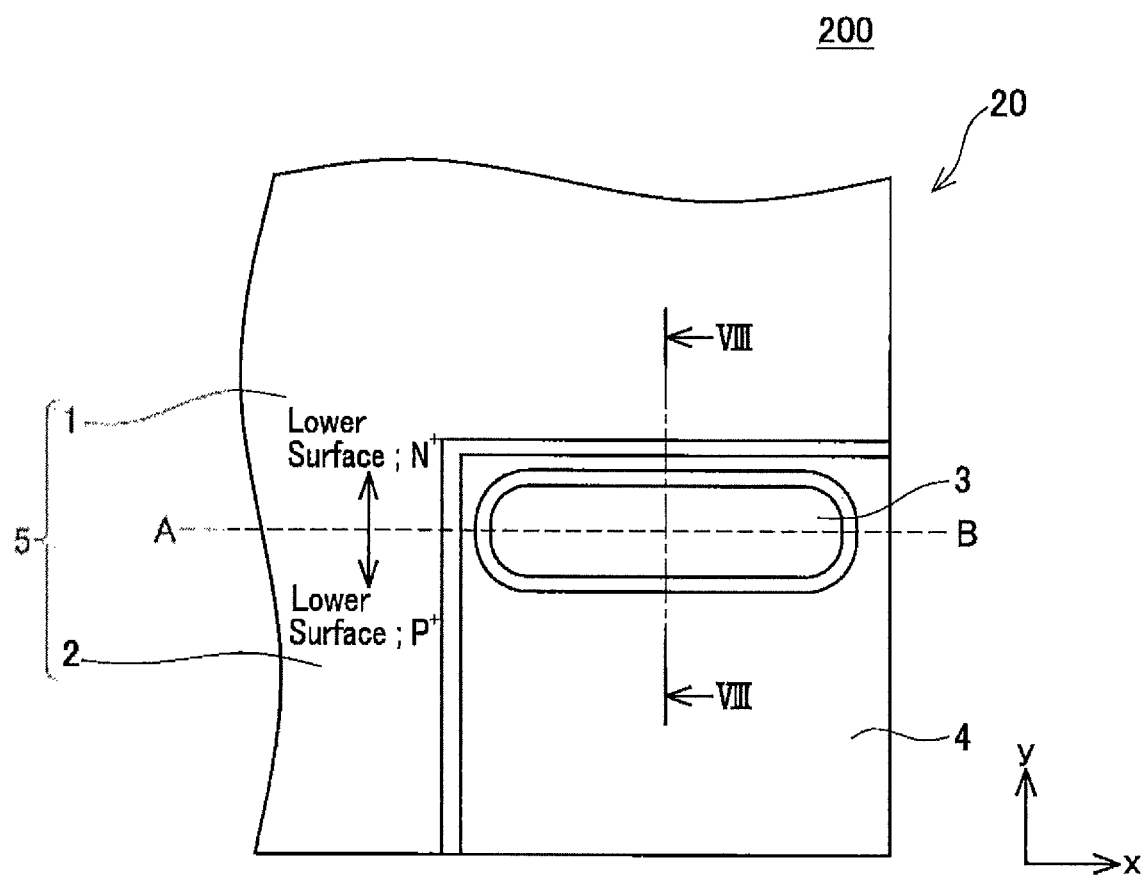
FIG. 7 is a plan view of a semiconductor device according to a second embodiment showing an enlargement of a vicinity of a boundary portion between a main region and a sense region.
Figure 8:
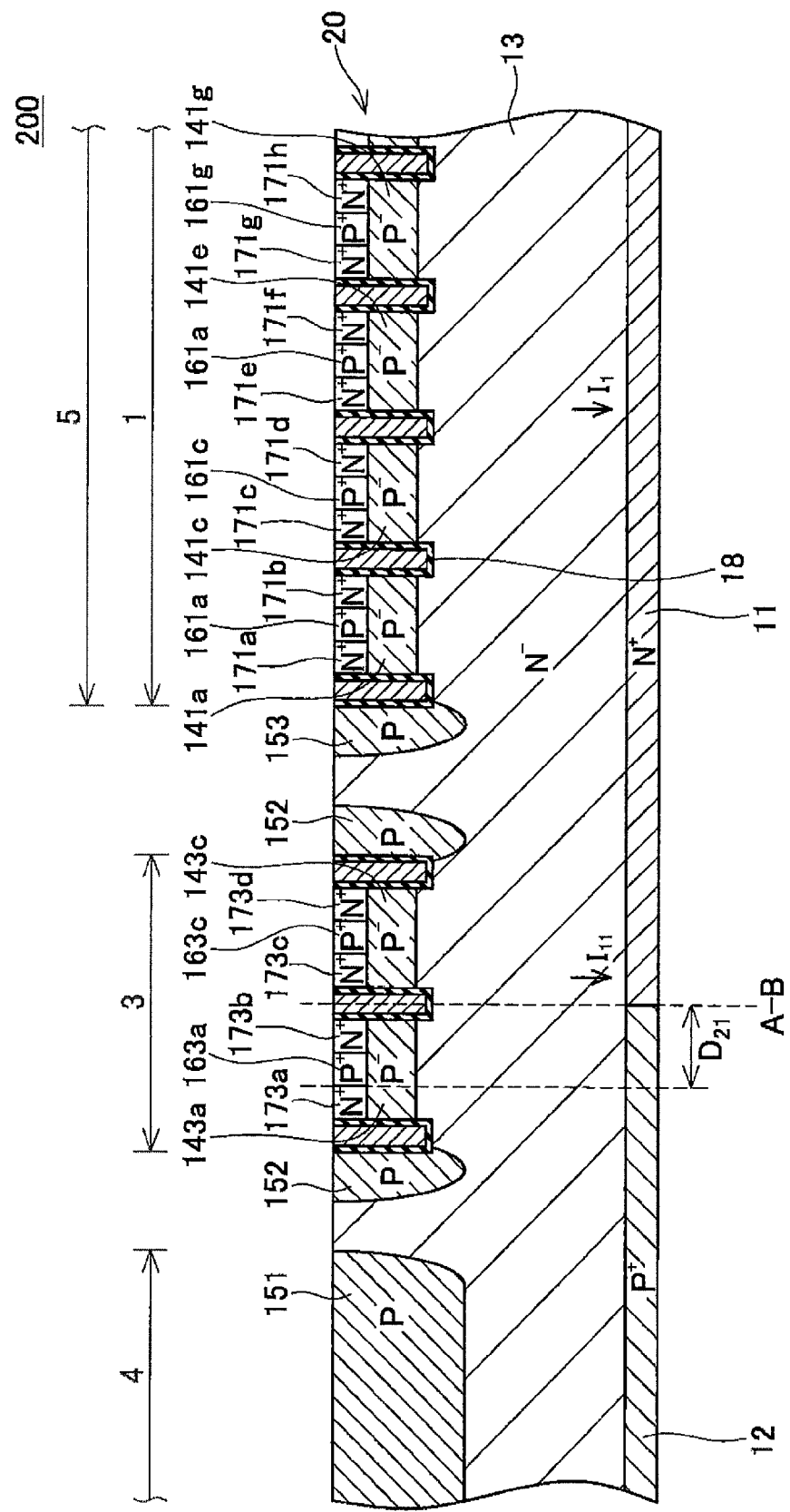
FIG. 8 is a cross-sectional view taken along line VIII-VIII in FIG. 7.

FIG. 7 is a plan view of a semiconductor device 200 according to a second embodiment showing a vicinity of a boundary portion between a main region 5 and a sense region 3 of a semiconductor substrate 20. FIG. 8 is an enlarged view of a cross-section taken along line VIII-VIII in FIG. 7. Moreover, the plan view showing an entire semiconductor device 200 is similar to the semiconductor device 100 shown in FIG. 1 and, also in the semiconductor device 200, the sense region 3 is smaller than the main region 5.

The semiconductor device 200 differs from the semiconductor device 100 in a position of a boundary (a line segment AB) between a first P$^+$ layer 12 and a first N$^+$ layer 11 formed on a lower surface side of the semiconductor substrate 20. Even in the semiconductor device 200, the boundary (the line segment AB) between the first P$^+$ layer 12 and the first N$^+$ layer 11 is parallel to an x axis direction shown in FIG. 7. In the main region 5, a region in which the first N$^+$ layer 11 is formed becomes a main diode region 1 and a region in which the first P$^+$ layer 12 is formed becomes an IGBT region 2. In a similar manner to the main diode region 1, the sense region 3 comprises a region in which the first N$^+$ layer 11 is formed and a region in which the first P$^+$ layer 12 is formed. Since other components are similar to those of the semiconductor device 100, similar components will be denoted using similar reference numerals in order to omit overlapping descriptions. Moreover, while the boundary (the line segment AB) between the first P$^+$ layer 12 and the first N$^+$ layer 11 in the main region 5 is not depicted in a cross section shown in FIG. 8, in a similar manner to the first embodiment, a boundary between the first N$^+$ layer 11 and the first P$^+$ layer 12 exists in the main region 5 of the semiconductor device 200, and a boundary between the main diode region 1 and the main IGBT region 2 is consistent with the boundary between the first N$^+$ layer 11 (a main cathode region) and the first P$^+$ layer 12 (a main collector region).

In the present embodiment, as shown in FIGS. 7 and 8, the boundary (the line segment AB) between the first P$^+$ layer 12 and the first N$^+$ layer 11 is positioned below the sense region 3. A distance $D_{21}$ from an end of the main cathode region (the first N$^+$ layer 11) on a side of the sense region 3 (in other words, the line segment AB) to an end of the second N$^+$ layer 173a that is a sense emitter region on a side of the main region 5 is $D_{21} \leq 298$ μm. A distance from second N$^+$ layers 173c and 173d that are installed on an upper surface side of the first N$^+$ layer 11 in a similar manner to the second N$^+$ layer 171a in the main diode region 1 from an end of the main cathode region on a side of the sense region 3 is smaller than zero. In other words, the second N$^+$ layers 173a to 173d that become a sense emitter region of the sense region 3 all have a distance that is equal to or shorter than 298 μm from the end of the main cathode region on a side of the sense region in a plan view of the semiconductor substrate. Therefore, in the present embodiment, the sense region 3 satisfies conditions as a second region.

In a similar manner to the first embodiment, the first N$^+$ layer 11 and the first P$^+$ layer 12 of the semiconductor device 200 are connected to a lower surface electrode (not shown), second N$^+$ layers 171a to 172d and 172a to 172d and second P$^+$ layers 161a, 161c, 162a, and 162c are connected to a main upper surface electrode (not shown), and second N$^+$ layers 173a to 173d and second P$^+$ layers 163a and 163c are connected to a sense upper surface electrode (not shown).

When a potential Va of the lower surface electrode is set lower than a potential Vb of the main upper surface electrode and a potential Vc of the sense upper surface electrode (Va<Vb, Vc), a main diode current $I_1$ flows through the main diode region 1 but a current does not flow through the main IGBT region 2. On the other hand, if the potential Va of the lower surface electrode is set higher than the potential Vb of the main upper surface electrode and the potential Vc of the sense upper surface electrode and a positive voltage (a positive bias) is applied to a gate electrode (Va>Vb, Vc), then a main IGBT current $I_2$ flows through the main IGBT region 2 but a current does not flow through the main diode region 1.

Since the second N$^+$ layers 173a to 173d that become a sense emitter region of the sense region 3 all have a distance that is equal to or shorter than 298 μm from the end of the main cathode region on a side of the sense region in a plan view of the semiconductor substrate and the sense region 3 is a second region, as shown in FIGS. 4 and 5, a current (a sense diode current) flows in a similar manner to the main diode region 1 when Va<Vb, Vc, and a magnitude of the sense diode current is equal to or greater than 90% of a maximum value of the sense diode current. On the other hand, when Va>Vb, Vc and a positive bias is applied to the gate electrode, a current hardly flows through the sense region 3. In the present embodiment, since a sufficiently large sense diode current $I_{11}$ flows through the sense region 3 in a stable manner, a sensing accuracy of the main diode current by the sense region 3 can be enhanced.

As described above, the present embodiment comprises a second region (a region in which a distance from the main cathode region to the sense emitter region in a plan view of the semiconductor substrate is equal to or shorter than 298 μm). Accordingly, since the sufficiently large sense diode current $I_{11}$ (a current that is equal to or greater than 90% of a maximum value of the sense diode current) can be obtained in a stable manner, a ratio between the main diode current that flows through the main diode region and the sense diode current that flows through the sense region becomes sufficiently large and stabilizes. As a result, the main diode current can be accurately sensed using the sense region 3.

Moreover, a ratio $I_{11}/I_1$ between the sense diode current $I_{11}$ and the main diode current $I_1$ is dependent on a ratio $S_{11}/S_1$ between an area $S_1$ of the main diode region 1 and an area $S_{11}$ of the second region of the sense region on the upper surface of the substrate. By adjusting the area ratio $S_{11}/S_1$, the ratio $I_{11}/I_1$ between the sense diode current $I_{11}$ and the main diode current $I_1$ can be adjusted. If the ratio $I_{11}/I_1$ is known, by sensing the sense diode current $I_{11}$, the main diode current $I_1$ can be sensed. For example, by connecting, in series, a shunt resistor (resistance value R) in advance to a circuit through which a sense diode current flows and measuring a voltage drop $RI_{11}$ on both ends of the shunt resistor, the sense diode current value $I_{11}$ can be sensed. The main diode current $I_1$ can be sensed based on the sensed sense diode current $I_{11}$ and the ratio $I_{11}/I_1$.

Moreover, it is obvious that the first embodiment and the second embodiment described above can be used in combination with each other. For example, two sense regions may be provided, wherein one is a sense region comprising a first region and the other is a sense region comprising a second region.

Third Embodiment

Figure 9:
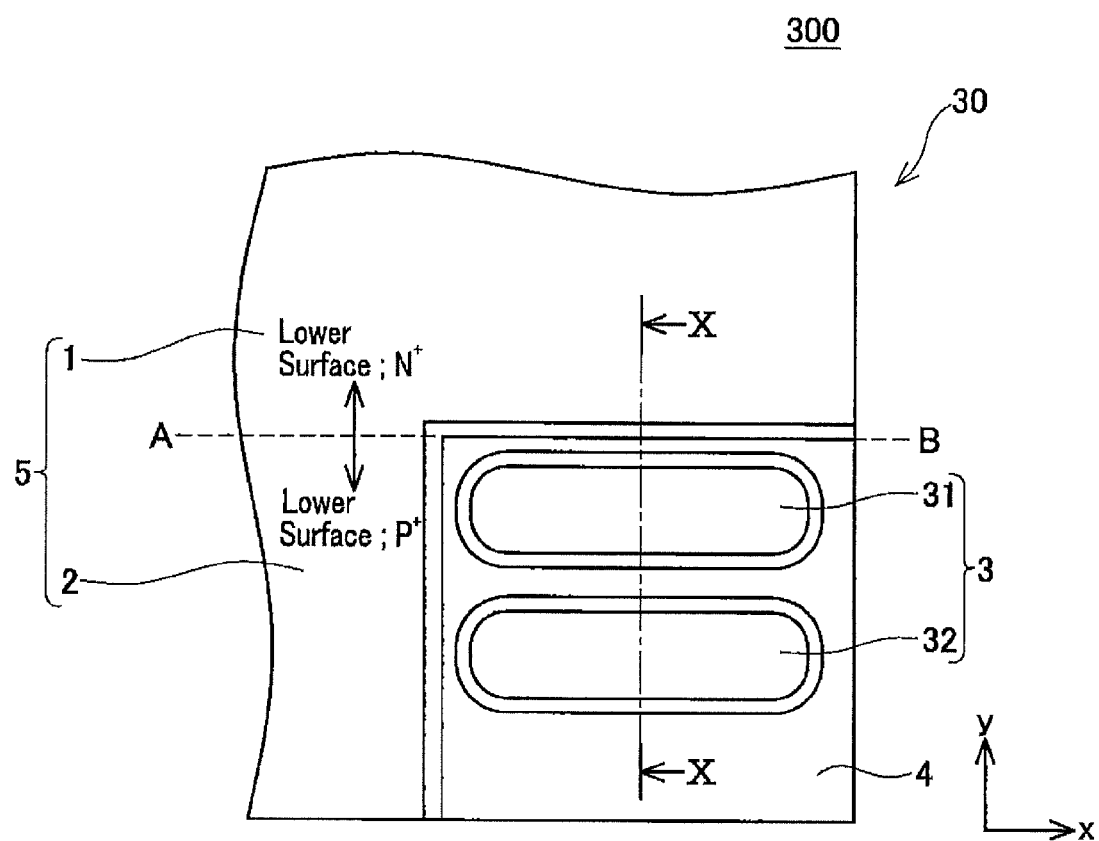
FIG. 9 is a plan view of a semiconductor device according to a third embodiment showing an enlargement of a vicinity of a boundary portion between a main region and a sense region.
Figure 10:
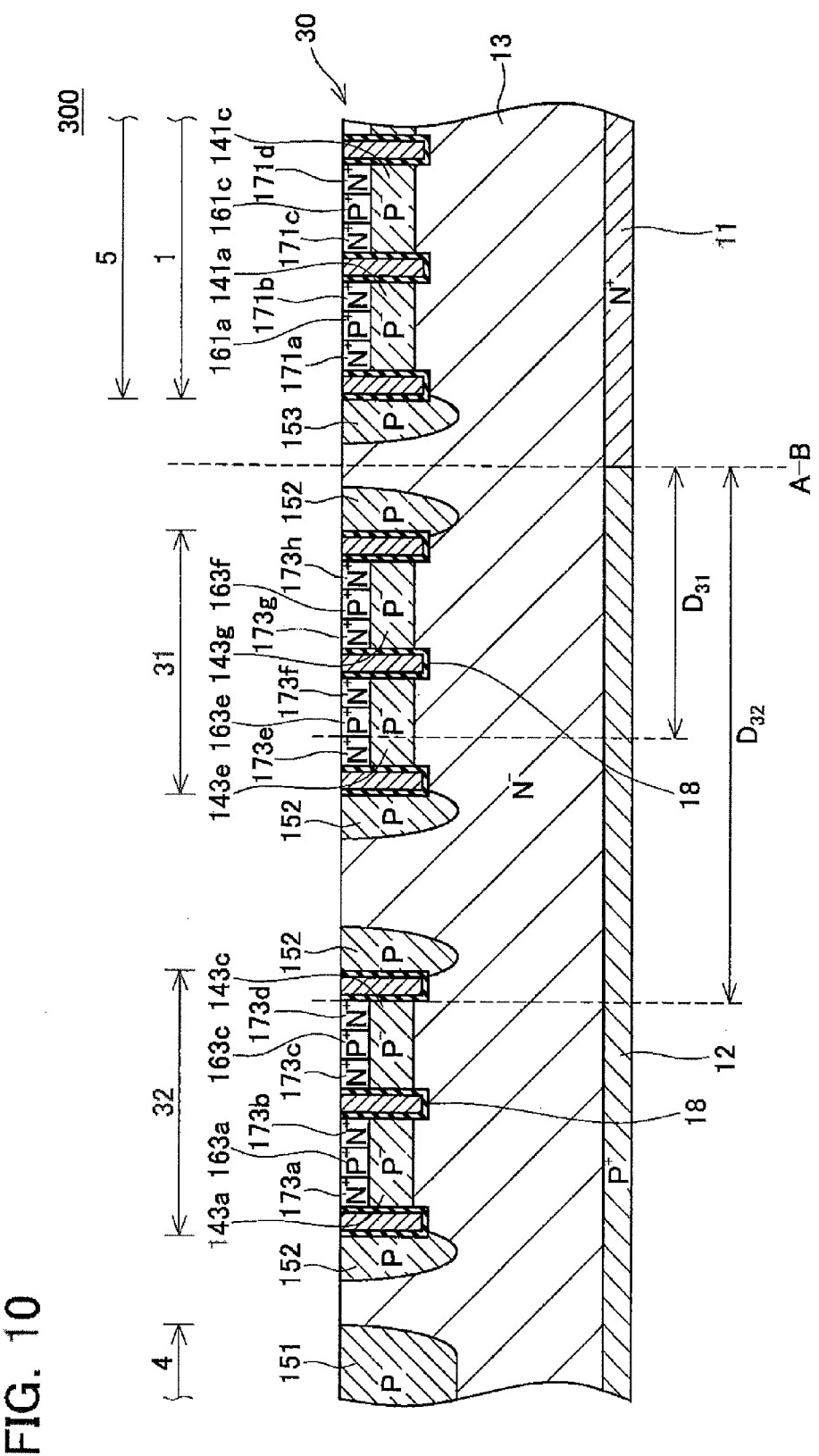
FIG. 10 is a cross-sectional view taken along line X-X in FIG. 9.

FIG. 9 is a plan view of a semiconductor device 300 according to a present embodiment showing a vicinity of a boundary portion between a main region 5 and a sense region 3 of a semiconductor substrate 30. FIG. 10 is an enlarged view of a cross-section taken along line X-X in FIG. 9. Moreover, the plan view showing an entire semiconductor device 300 is similar to the semiconductor device 100 shown in FIG. 1 and, also in the semiconductor device 300, the sense region 3 is smaller than the main region 5.

As shown in FIGS. 9 and 10, the semiconductor device 300 differs from the semiconductor device 100 in a position of a boundary (a line segment AB) between a first P$^+$ layer 12 and a first N$^+$ layer 11 formed on a lower surface side of the semiconductor substrate 30. Even in the semiconductor device 300, the boundary (the line segment AB) between the first P$^+$ layer 12 and the first N$^+$ layer 11 is parallel to an x axis direction shown in FIG. 9. In the main region 5, a region in which the first N$^+$ layer 11 is formed becomes a main diode region 1 and a region in which the first P$^+$ layer 12 is formed becomes an IGBT region 2. In addition, in the semiconductor device 300, the sense region 3 includes a sense region 31 and a sense region 32. The sense region 31 and the sense region 32 are arranged on an upper surface side of the first P$^+$ layer 12 in a similar manner to the main IGBT region 2 (not shown in FIG. 10). Since other components are similar to those of the semiconductor device 100, similar components will be denoted using similar reference numerals in order to omit overlapping descriptions. Moreover, while the boundary (the line segment AB) between the first P$^+$ layer 12 and the first N$^+$ layer 11 in the main region 5 is not depicted in a cross section shown in FIG. 10, in a similar manner to the first and second embodiments, a boundary between the first N$^+$ layer 11 and the first P$^+$ layer 12 exists in the main region 5 of the semiconductor device 300, and a boundary between the main diode region 1 and the main IGBT region 2 is consistent with the boundary between the first N$^+$ layer 11 (a main cathode region) and the first P$^+$ layer 12 (a main collector region).

In the present embodiment, as shown in FIGS. 9 and 10, the sense region 31 and the sense region 32 are installed adjacent to each other. The sense region 31 and the sense region 32 are respectively enclosed by a P layer 152 that is a diffusion layer in a similar manner to the sense region 3 in the first embodiment. A main collector region of the main IGBT region 2 and a sense collector region of the sense region 31 and the sense region 32 are formed as a same layer (the first P$^+$ layer 12).

The sense region 31 is arranged adjacent to the main diode region 1, and the sense region 32 is arranged at a position further than the sense region 31 from the main diode region 1. A part of the boundary (the line segment AB) between the first P$^+$ layer 12 and the first N$^+$ layer 11 is positioned in a region between the sense region 31 and the main diode region 1. A region between the sense region 31 and the sense region 32 is provided only with an N$^-$ layer 13 and a P layer 152 above the first P$^+$ layer 12 and is a region that does not contribute to electrical conduction.

A second N$^+$ layer 173e that becomes a sense emitter region of the sense region 31 has a distance $D_{31}$ that is equal to or shorter than 298 μm from an end of the first N$^+$ layer 11 that is a main cathode region on a side of the sense region in a plan view of the semiconductor substrate. In other words, the second N$^+$ layers 173e to 173h of the sense region 31 all have a distance that is equal to or shorter than 298 μm from the end of the main cathode region (the first N$^+$ layer 11) on the side of the sense region in a plan view of the semiconductor substrate. Therefore, the sense region 31 satisfies conditions as a second region. A second N$^+$ layer 173d that becomes a sense emitter region of the sense region 32 has a distance $D_{32}$ that is equal to or longer than 615 μm from the end of the main cathode region (the first N$^+$ layer 11) on the side of the sense region in a plan view of the semiconductor substrate. In other words, the second N$^+$ layers 173a to 173d of the sense region 32 all have a distance that is equal to or longer than 615 μm from the end of the main cathode region (the first N$^+$ layer 11) on the side of the sense region in a plan view of the semiconductor substrate. Therefore, the sense region 32 satisfies conditions as a first region.

In a similar manner to the first and second embodiments, the first N$^+$ layer 11 and the first P$^+$ layer 12 of the semiconductor device 300 are connected to a lower surface electrode, second N$^+$ layers 171a to 171d and 172a to 172d and second P$^+$ layers 161a, 161c, 162a, and 162c (not shown in FIG. 10) of the main diode region 1 and the main IGBT region 2 are connected to a main upper surface electrode, and second N$^+$ layers 173a to 173h and second P+ layers 161a, 161c, 161e, and 161g of the sense region 31 and the sense region 32 are connected to a sense upper surface electrode. Since the sense regions 31 and 32 are arranged adjacent to each other, for example, the sense regions 31 and 32 can be connected by a single electrode pad.

When a potential Va of the lower surface electrode is set lower than a potential Vb of the main upper surface electrode and a potential Vc of the sense upper surface electrode (Va<Vb, Vc), a main diode current $I_1$ flows through the main diode region 1 but a current does not flow through the main IGBT region 2.

Since the sense region 31 satisfies conditions as a second region, as shown in FIGS. 4 and 5, a sense diode current $I_{11}$ flows when Va<Vb, Vc in a similar manner to the main diode region 1. A magnitude of the sense diode current $I_{11}$ is equal to or greater than 90% of a maximum value of the sense diode current. On the other hand, when Va>Vb, Vc and a positive bias is applied to the gate electrode, a current hardly flows through the sense region 31.

Since the sense region 32 satisfies conditions as a first region, as shown in FIGS. 4 and 5, a current hardly flows through the sense region 32 when Va<Vb, Vc. On the other hand, when Va>Vb, Vc and a positive bias is applied to the gate electrode, a sense IGBT current $I_{12}$ flows through the sense region 32 in a similar manner to the main IGBT region 2. A magnitude of the sense IGBT current $I_{12}$ is equal to or greater than 90% of a maximum value of the sense IGBT current.

In the present embodiment, by using the sense region 31 and the sense region 32, when the main diode current $I_1$ flows through the main region 5, a sufficiently large sense diode current $I_{11}$ can be obtained in a stable manner. When the main IGBT current $I_2$ flows through the main region, a sufficiently large sense IGBT current $I_{21}$ can be obtained in a stable manner. Therefore, a sensing accuracy of both the main diode current and the main IGBT current can be enhanced.

In the present embodiment, the sense region 31 that senses the main diode current is arranged adjacent to the sense region 32 that senses the main IGBT current, and the sense regions 31 and 32 are connected to a single sense upper surface electrode. Accordingly, wiring and the like of the sense regions can be simplified.

In addition, in the present embodiment, a region that does not contribute to electrical conduction is formed between the sense region 31 (the sense region for sensing the main diode current) and the sense region 32 (the sense region for sensing the main IGBT current). When the sense region 31 and the sense region 32 are arranged adjacent to each other as shown in FIGS. 9 and 10, the region between the sense region 31 and the sense region 32 has a distance from the main cathode region which causes a sense diode current and a sense IGBT current to become unstable as shown in FIGS. 4 and 5. By constructing the region in which the sense diode current and the sense IGBT current become unstable as the region that does not contribute to electrical conduction, the measurement accuracy of the sense diode current and the sense IGBT current can be further enhanced.

Figure 11:
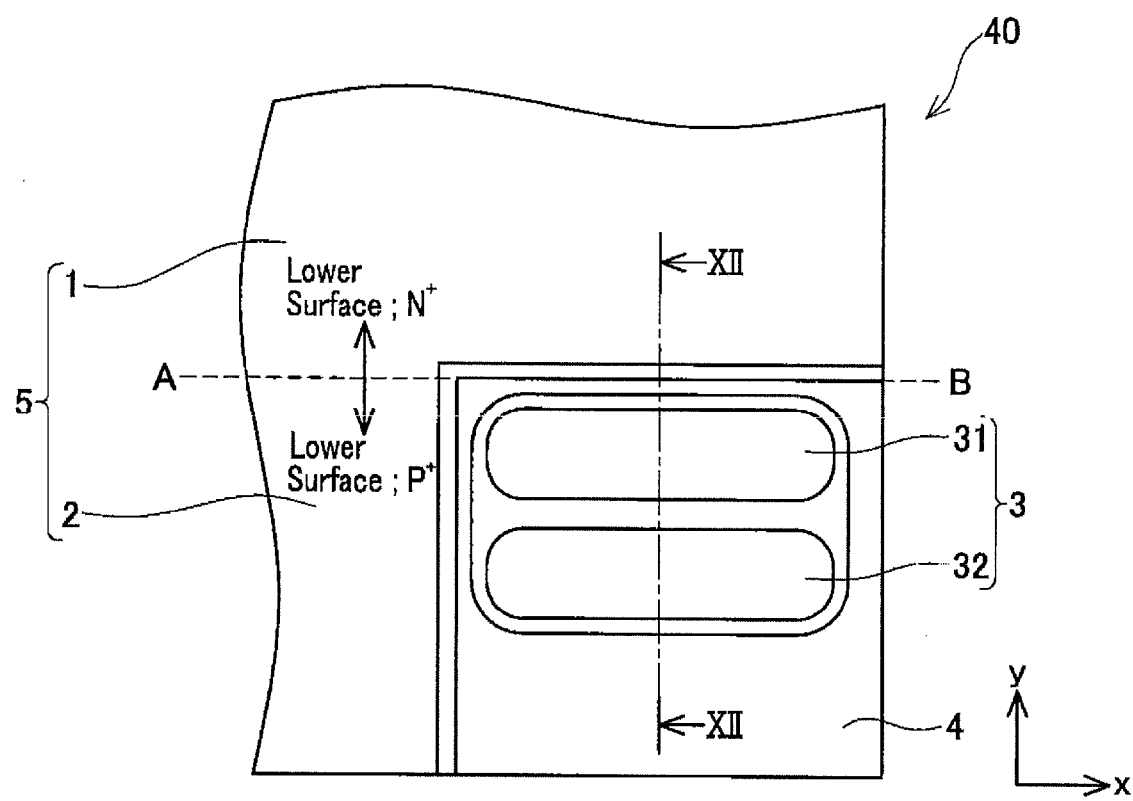
FIG. 11 is a plan view of a semiconductor device according to a modification showing an enlargement of a vicinity of a boundary portion between a main region and a sense region.
Figure 12:
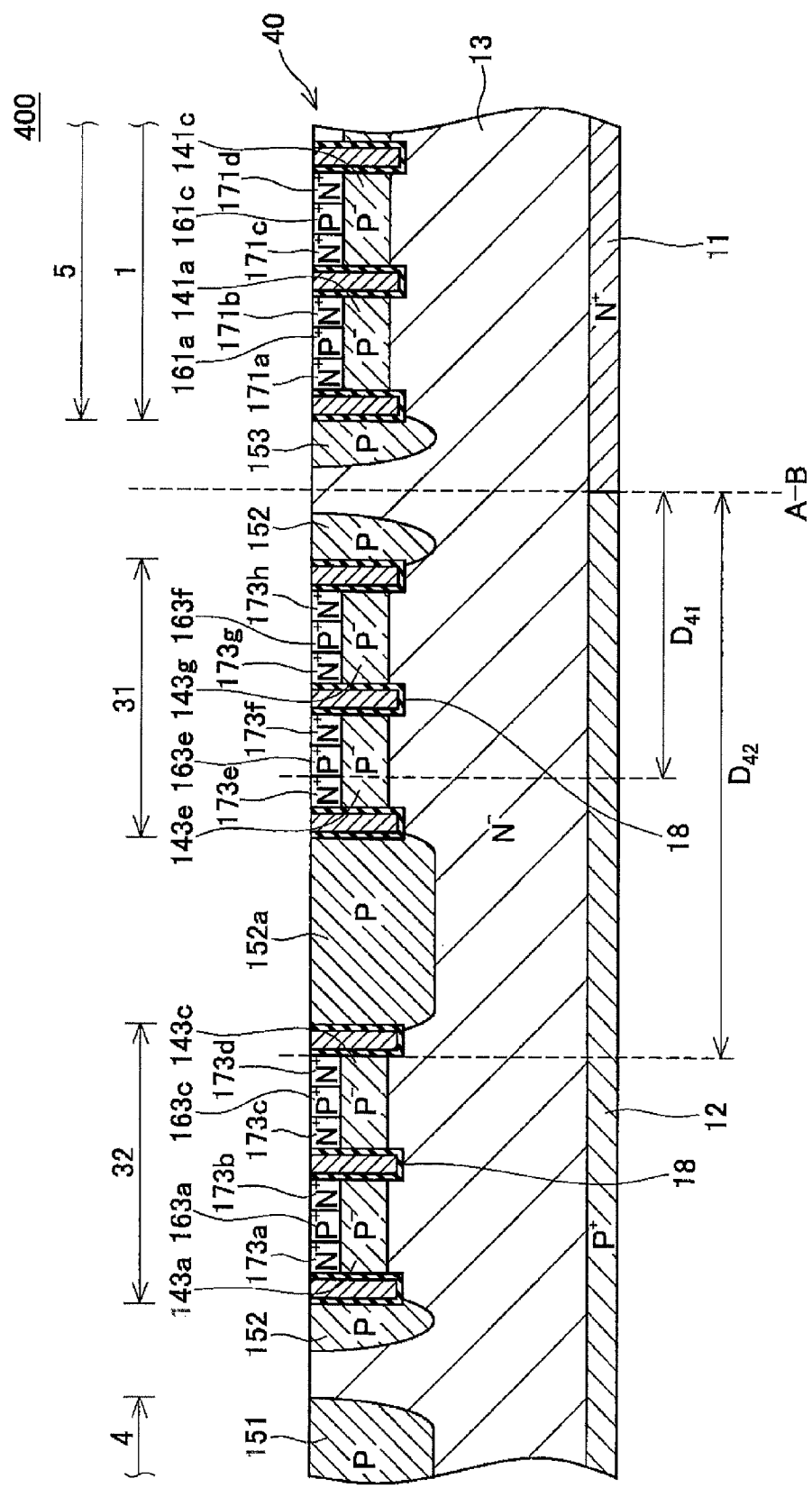
FIG. 12 is a cross-sectional view taken along line XII-XII in FIG. 11.

Moreover, as in a case of a semiconductor device 400 shown in FIGS. 11 and 12, a P layer 152a that is a diffusion layer may be formed on an entire upper surface side of an N⁻ layer 13 in a region between the sense region 31 and the sense region 32. The P layer 152a is an element isolation layer. The semiconductor device 400 is a modification of the semiconductor device 300, and differs from the semiconductor device 300 in that the P layer 152a is formed on the entire upper surface side of the N⁻ layer 13 in the region between the sense region 31 and the sense region 32. Since other components are similar to those of the semiconductor device 300, similar components will be denoted by similar reference numerals in order to omit overlapping descriptions. In the semiconductor device 400, since the sense region 31 and the sense region 32 are separated from each other by a single P layer 152; a distance between the sense region 31 and the sense region 32 can be shortened. Specifically, a distance between the sense region 31 and the sense region 32 in a y axis direction shown in FIG. 11 can be set shorter than a distance between the sense region 31 and the sense region 32 in a y axis direction shown in FIG. 9. In this case, a region having a distance from the main cathode region which causes a sense diode current and a sense IGBT current to become unstable as shown in FIGS. 4 and 5 is favorably designed so as to fit below the P layer 152a. Accordingly, a measurement accuracy of a sense diode current and a sense IGBT current can be further enhanced.

Fourth Embodiment

Figure 13:
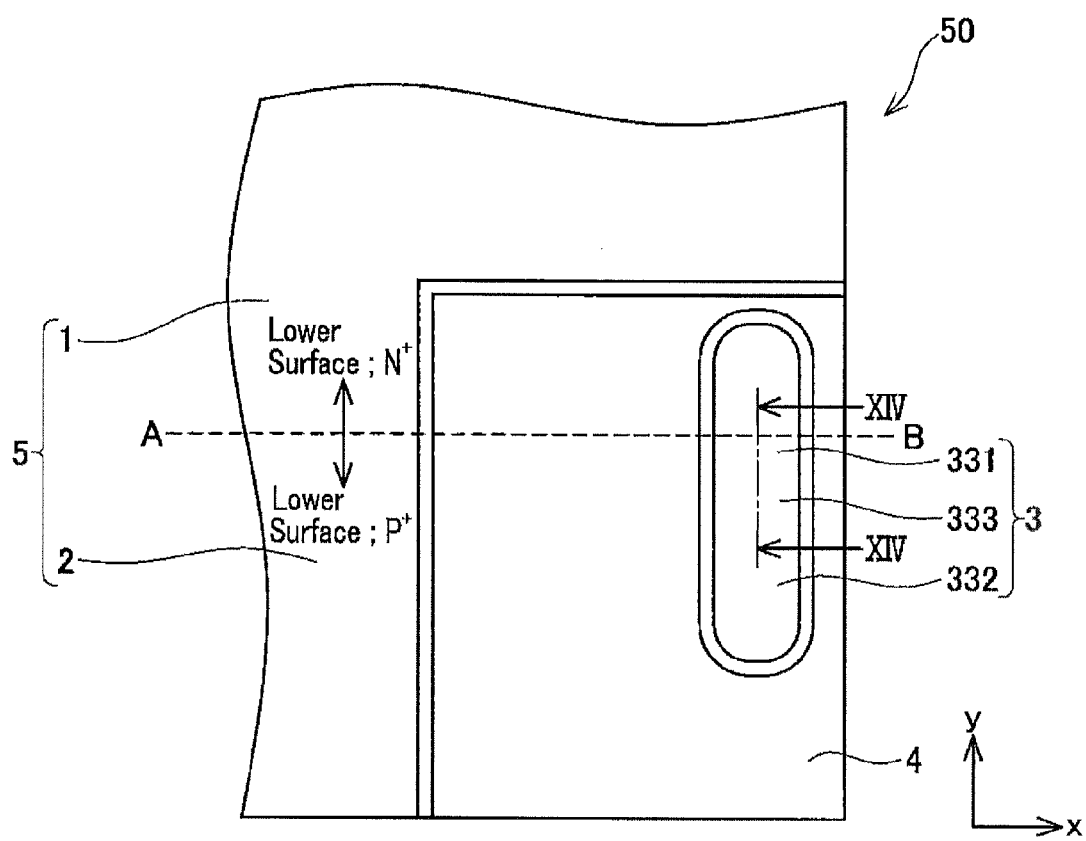
FIG. 13 is a plan view of a semiconductor device according to a fourth embodiment showing an enlargement of a vicinity of a boundary portion between a main region and a sense region.
Figure 14:
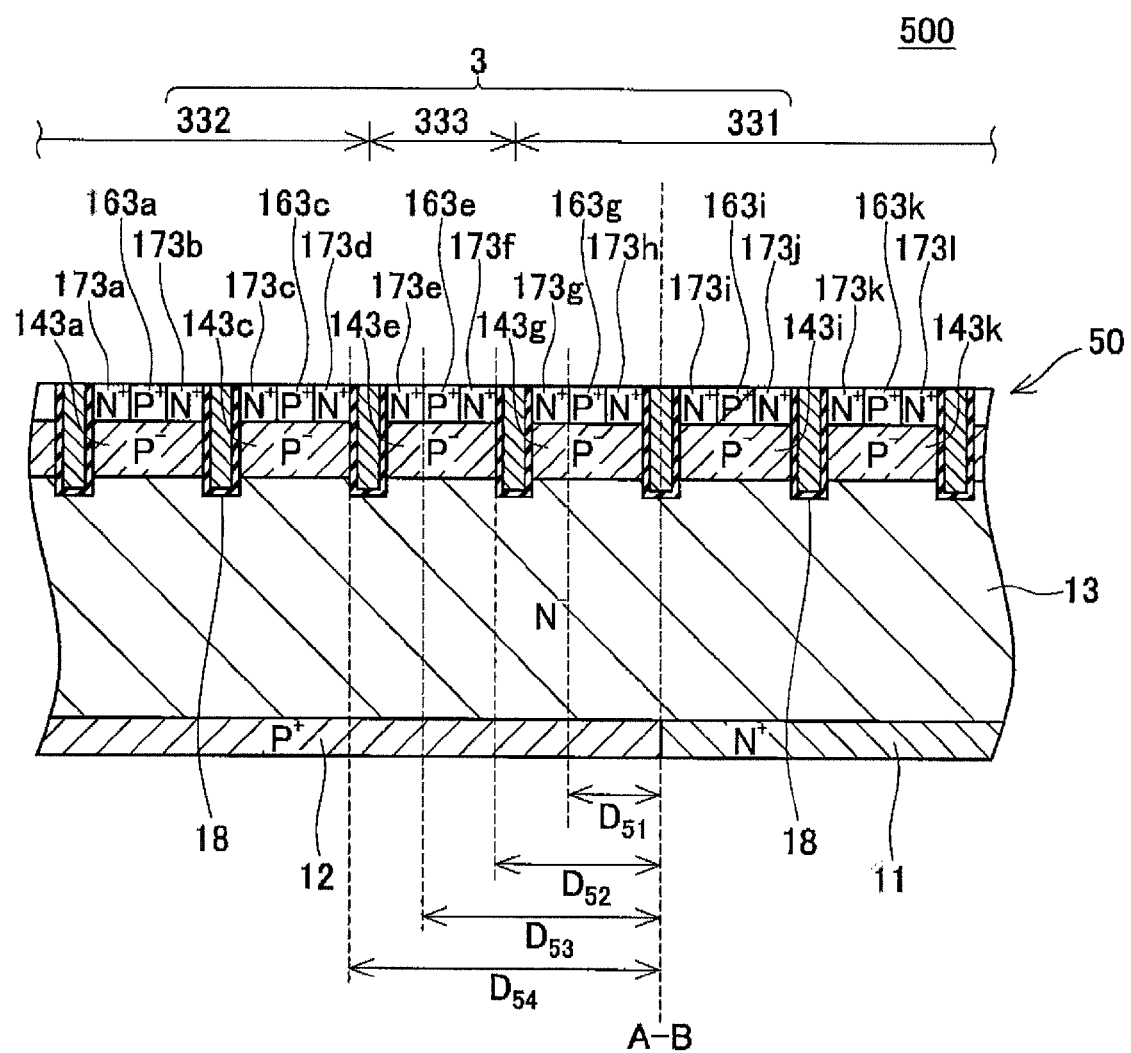
FIG. 14 is a cross-sectional view taken along line XIV-XIV in FIG. 13.

FIG. 13 is a plan view of a semiconductor device 500 according to a present embodiment showing a vicinity of a boundary portion between a main region 5 and a sense region 3 of a semiconductor substrate 50. FIG. 14 is an enlarged view of a cross-section taken along line XIV-XIV in FIG. 13. Moreover, the plan view showing an entire semiconductor device 500 is similar to the semiconductor device 100 shown in FIG. 1 and, also in the semiconductor device 500, the sense region 3 is smaller than the main region 5.

The semiconductor device 500 differs from the semiconductor device 100 in a position of a boundary (a line segment AB) between a first P+ layer 12 and a first N+ layer 11 formed on a lower surface side of the semiconductor substrate 50. Even in the semiconductor device 500, the boundary (the line segment AB) between the first P+ layer 12 and the first N+ layer 11 is parallel to an x axis direction shown in FIG. 13. In the main region 5, a region in which the first N+ layer 11 is formed becomes a main diode region 1 and a region in which the first P+ layer 12 is formed becomes a main IGBT region 2. In a similar manner to the main diode region 1, the sense region 3 comprises a region in which the first N+ layer 11 is formed and a region in which the first P+ layer 12 is formed. Another difference from the semiconductor device 100 is that a shape of the sense region 3 in a plan view is shorter in the x axis direction and longer in a y axis direction shown in FIG. 13. In other words, the sense region 3 is short in a direction parallel to an end of a main cathode region on a side of the sense region (the x axis direction) and long in a direction perpendicular to the end of the main cathode region on the side of the sense region (the y axis direction). Since other components are similar to those of the semiconductor device 100, similar components will be denoted using similar reference numerals in order to omit overlapping descriptions. Moreover, while a cross-sectional structure of the main region 5 is not depicted in the cross section shown in FIG. 14, in a similar manner to the first embodiment, the boundary between the first N+ layer 11 and the first N+ layer 12 exists in the main region 5 of the semiconductor device 500, and a boundary between the main diode region 1 and the main IGBT region 2 is consistent with the boundary between the first N+ layer 11 (a main cathode region) and the first P+ layer 12 (a main collector region). In addition, a longitudinal direction of a trench gate 18 is parallel to an x-axis direction in a similar manner to the semiconductor device 100.

In FIGS. 13 and 14, among the sense region 3, a second N+ layer 173g of a region 331 has a distance $D_{s1}$ that is equal to or shorter than 298 μm from an end of the main cathode region (the first N⁺ layer 11) on the side of the sense region 3 (in other words, the line segment AB). In other words, second N⁺ layers 173g to 173l of the region 331 all have a distance that is equal to or shorter than 298 μm from the end of the main cathode region on the side of the sense region 3 in a plan view of the semiconductor substrate. Therefore, in the present embodiment, the region 331 satisfies conditions as a second region. A second N⁺ layer 173d of a region 332 has a distance $D_{53}$ that is equal to or longer than 615 μm from the end of the main cathode region on the side of the sense region 3 in a plan view of the semiconductor substrate. In other words, second N⁺ layers 173a to 173d of the region 332 all have a distance that is equal to or longer than 615 μm from the end of the main cathode region on the side of the sense region in a plan view of the semiconductor substrate. Therefore, in the present embodiment, the region 332 satisfies conditions as a first region. Second N⁺ layers 173e and 173f of a region 333 have a distance $D_{52}$ that is expressed as 298 μm<$D_{52}$<615 μm from the end of the main cathode region on the side of the sense region in a plan view of the semiconductor substrate. In other words, the second N⁺ layers 173e and 173f of the region 333 neither satisfy conditions as a first region nor conditions as a second region. Compared to the region 331 and the region 332, the region 333 has a smaller element area (an area in the plan view of the semiconductor substrate).

Since the sense region 3 comprises the sense region 331, when a main diode current $I_1$ flows through the main region, a sufficiently large sense diode current $I_{11}$ can be obtained in a stable manner. In addition, since the sense region 3 comprises the sense region 332, when a main IGBT current $I_2$ flows through the main region, a sufficiently large sense IGBT current $I_{21}$ can be obtained in a stable manner. Although the region 333 is a region in which the sense diode current $I_{11}$ and the sense IGBT current $I_{21}$ become unstable, since the region 333 has a smaller element area than the regions 331 and 332, a sensing accuracy of the main diode current by the region 331 and a sensing accuracy of the main IGBT current by the region 332 can be sufficiently secured. The present embodiment enables a reduction in an installation space of the sense region as compared to the case where the main diode current and the main IGBT current are sensed using two sense regions as is the case of the third embodiment.

In addition, the sense region 3 of the semiconductor device 500 is designed so that a shape of the sense region 3 in the plan view is short in a direction parallel to an end of the main cathode region on the side of the sense region (a direction parallel to a trench gate 18) and long in a direction perpendicular to the end of the main cathode region on the side of the sense region (a direction perpendicular to the trench gate 18). Therefore, a proportion of an element area of the region 333 having a distance $D_{52}$ that is expressed as 298 μm<$D_{52}$<615 μm from the end of the main cathode region on the side of the sense region 3 becomes smaller with respect to an element area of the sense region 3. By reducing an element area of the region 333 compared to element areas of the region 331 and the region 332, the sensing accuracy of the main diode current and the main IGBT current can be enhanced.

Since the embodiments and modifications of the present invention described above enable the sense diode current and the sense IGBT current which flow through the sense region to be stabilized and be obtained as sufficiently large currents in the semiconductor device in which the diode and the IGBT are formed in the main region of the same semiconductor substrate, the sensing accuracy of the main IGBT current and the main diode current by the sense region can be enhanced. Moreover, while the main cathode region and the main collector region are adjacent to each other in the main region in the embodiments and modifications described above, another semiconductor layer may alternatively be formed between the main cathode region and the main collector region.

Moreover, the semiconductor devices described in the embodiments and modifications presented above can be manufactured by applying techniques used in a manufacturing process of a conventional semiconductor device. Since the semiconductor devices can be manufactured without significantly modifying the manufacturing process of the conventional semiconductor device, the semiconductor devices can be manufactured without significantly increasing labor, cost, and time.

While examples of the present embodiment have been described in detail, such examples are merely illustrative and are not intended to limit the scope of claims. Techniques described in the scope of claims include various modifications and changes of the specific examples illustrated above.

It is to be understood that the technical elements described in the present description and the drawings exhibit technical usefulness solely or in various combinations thereof and shall not be limited to the combinations described in the claims at the time of filing. Furthermore, the techniques illustrated in the present description and the drawings are to achieve a plurality of objectives at the same time, whereby technical usefulness is exhibited by attaining any one of such objectives.

The invention claimed is:

1. A semiconductor device comprising a semiconductor substrate including a main region and a sense region, the sense region being smaller than the main region in a plan view of the semiconductor substrate, wherein
   the main region comprises a main diode and a main IGBT,
   the main diode comprises:
      a first conductivity type main anode region formed on an upper surface of the semiconductor substrate,
      a second conductivity type main diode drift region formed on a lower side of the main anode region, and
      a second conductivity type main cathode region formed on a lower side of the main diode drift region and on a lower surface of the semiconductor substrate;
   the main IGBT comprises:
      a first conductivity type main collector region formed on a lower surface of the semiconductor substrate,
      a second conductivity type main drift region formed on an upper side of the main collector region,
      a first conductivity type main body region formed on an upper side of the main drift region and on an upper surface of the semiconductor substrate,
      a second conductivity type main emitter region formed on a part of an upper surface of the main body region, and
      a main insulated gate electrode formed from an upper surface of the main emitter region to the depth in which the main body region contacting with the main drift region; and
   the sense region comprises:
      a first conductivity type sense collector region formed on a part of a lower surface of the semiconductor substrate,
      a second conductivity type sense drift region formed on an upper side of the sense collector region,
      a first conductivity type sense body region formed on an upper side of the sense drift region and on an upper surface of the semiconductor substrate,
      a second conductivity type sense emitter region formed on a part of an upper surface of the sense body region, and a sense insulated gate electrode formed from an upper surface of the sense emitter region to the depth in which the sense body region contacting with the sense drift region, the sense region includes a first region, in which a distance from the main cathode region to the sense emitter region in the plan view of the semiconductor substrate being equal to or longer than 615 µm.

2. The semiconductor device according to claim 1, further comprising:

a second region, in which a distance from the main cathode region to the sense emitter region in the plan view of the semiconductor substrate being equal to or shorter than 298 µm.

3. The semiconductor device according to claim 2, wherein the sense drift region, the sense body region, the sense emitter region, and the sense insulated gate electrode are formed sequentially from the first region to the second region in the plan view of the semiconductor substrate.

4. The semiconductor device according to claim 2, further comprising:

a diffusion layer formed in at least a part of a region between the first region and the second region, the diffusion layer extending from the upper surface of the semiconductor substrate in a depth direction.

5. The semiconductor device according to claim 4, wherein the diffusion layer is formed in a region of which distance from the main cathode region in the plan view of the semiconductor substrate is longer than 298 µm and shorter than 615 µm.

6. A semiconductor device comprising a semiconductor substrate including a main region and a sense region, the sense region being smaller than the main region in a plan view of the semiconductor substrate, wherein the main region comprises a main diode and a main IGBT, the main diode comprises:

a first conductivity type main anode region formed on an upper surface of the semiconductor substrate, a second conductivity type main diode drift region formed on a lower side of the main anode region, and a second conductivity type main cathode region formed on a lower side of the main diode drift region and on a lower surface of the semiconductor substrate;

the main IGBT comprises:

a first conductivity type main collector region formed on a lower surface of the semiconductor substrate, a second conductivity type main drift region formed on an upper side of the main collector region, a first conductivity type main body region formed on an upper side of the main drift region and on an upper surface of the semiconductor substrate, a second conductivity type main emitter region formed on a part of an upper surface of the main body region, and a main insulated gate electrode formed from an upper surface of the main emitter region to the depth in which the main body region contacting with the main drift region; and the sense region comprises:

a first conductivity type sense collector region formed on a part of a lower surface of the semiconductor substrate, a second conductivity type sense drift region formed on an upper side of the sense collector region, a first conductivity type sense body region formed on an upper side of the sense drift region and on an upper surface of the semiconductor substrate, a second conductivity type sense emitter region formed on a part of an upper surface of the sense body region, and a sense insulated gate electrode formed from an upper surface of the sense emitter region to the depth in which the sense body region contacting with the sense drift region, the sense region includes a second region, in which a distance from the main cathode region to the sense emitter region in a plan view of the semiconductor substrate being equal to or shorter than 298 µm.

* * * * *

UNITED STATES PATENT AND TRADEMARK OFFICE
CERTIFICATE OF CORRECTION

PATENT NO. : 8,471,291 B2
APPLICATION NO. : 13/635019
DATED : June 25, 2013
INVENTOR(S) : Akitaka Soeno It is certified that error appears in the above-identified patent and that said Letters Patent is hereby corrected as shown below:

In the Specification

Column 3, line 51, change "FIG. 3 is a cross-sectional view taken along line in FIG. 2" to -- FIG. 3 is a cross-sectional view taken along line III-III in FIG. 2 --

Column 4, line 30, change "an enlarged view of a cross section taken along a line in FIG. 2" to -- an enlarged view of a cross section taken along a line III-III in FIG. 2 --

Column 5, line 24, change "$P^{3+}$ layers" to -- $P^+$ layers --

Column 8, Equation 1(2), change

"$$f_2(D) = 40 + 30 \times \frac{\exp\left(\frac{D-400}{100}\right) - \exp\left(-\frac{D-400}{100}\right)}{\exp\left(\frac{D-400}{100}\right) + \exp\left(-\frac{D-400}{100}\right)} \quad (2)$$"

to $$f_2(D) = 40 + 30 \times \frac{\exp\left(-\frac{D-400}{100}\right) - \exp\left(\frac{D-400}{100}\right)}{\exp\left(-\frac{D-400}{100}\right) + \exp\left(\frac{D-400}{100}\right)} \quad (2)$$

--

Column 8, line 64, change "from an, end" to -- from an end --

Column 11, line 6, change "a current (a sense diode current)" to

-- a current $I_{11}$ (a sense diode current) --

Signed and Sealed this
Twenty-ninth Day of October, 2013

Teresa Stanek Rea
*Deputy Director of the United States Patent and Trademark Office*